United States Patent [19]

Zimmer

[11] Patent Number: 4,872,604
[45] Date of Patent: Oct. 10, 1989

[54] HEATED TOOL WITH STOP MECHANISM

[75] Inventor: Gero Zimmer, Munich, Fed. Rep. of Germany

[73] Assignee: Productech Reflow Solder Equipment Inc., Rolling Hills Estate, Calif.

[21] Appl. No.: 215,626

[22] Filed: Jul. 6, 1988

[30] Foreign Application Priority Data

Jul. 9, 1987 [DE] Fed. Rep. of Germany ....... 3722726

[51] Int. Cl.$^4$ .................................................. B23K 3/00
[52] U.S. Cl. .......................................... 228/9; 228/51; 219/233; 219/85.16
[58] Field of Search ............... 228/180.2, 228, 6.2, 228/44.7, 51; 219/229, 233, 243, 209, 210, 78.01, 85 D, 85 F, 8 FG, 78.13

[56] References Cited

U.S. PATENT DOCUMENTS

| 3,551,645 | 12/1970 | Stoll | 219/243 |
| 3,596,050 | 7/1971 | Tikijian | 228/10 |
| 3,895,214 | 7/1975 | Winter | 228/51 |
| 3,990,863 | 11/1976 | Palmer | 228/51 |
| 4,255,644 | 3/1981 | Delorme | 228/44.7 |
| 4,720,035 | 1/1988 | Isogai | 228/44.7 |

FOREIGN PATENT DOCUMENTS

| 2218750 | 10/1974 | France | 219/233 |
| 2378594 | 9/1978 | France | 219/233 |
| 2399179 | 3/1979 | France | 219/233 |
| 128271 | 10/1979 | Japan | 228/4.5 |

Primary Examiner—Richard K. Seidel
Assistant Examiner—Samuel M. Heinrich
Attorney, Agent, or Firm—Notaro & Michalos

[57] ABSTRACT

An apparatus for connecting one part to another by heating the parts comprises a heated tool with a heating bar, having a heated surface for being brought into contact with the one part and for being moved toward the other part, and a stop mechanism in the form of a mechanical stop bar, or sensing arrangement for stopping the movement of the heated tool toward the other part when a selected spacing between the heated tool and the other part is reached.

13 Claims, 2 Drawing Sheets

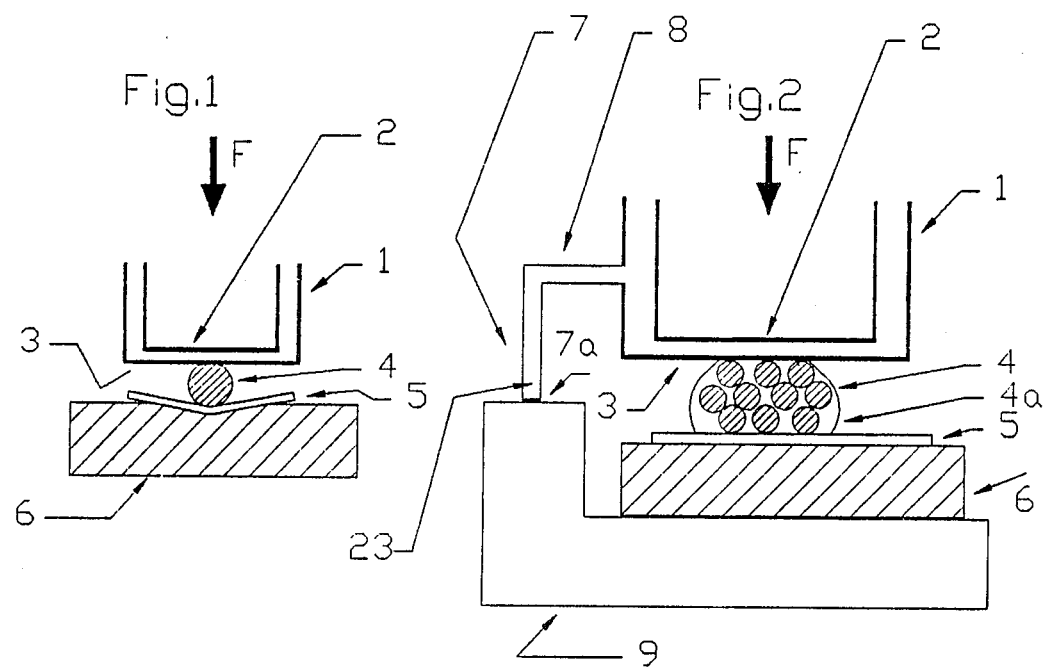
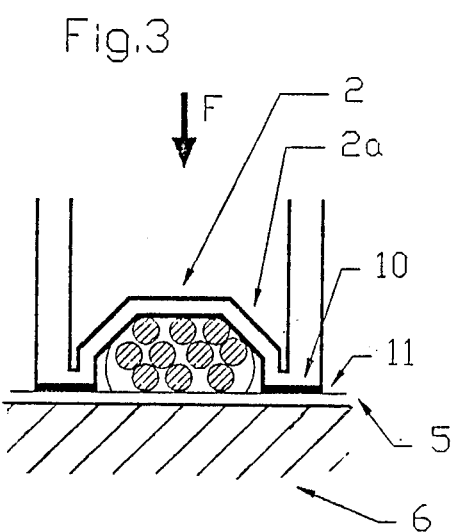
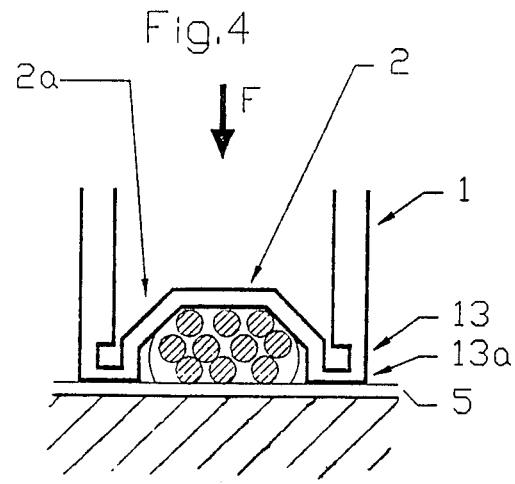

ID CARD NAME: 4,872,604

HEATED TOOL WITH STOP MECHANISM

FIELD AND BACKGROUND OF THE INVENTION

The present invention relates in general to heated tools and, in particular, to a new and useful apparatus for connecting one part to another by heating the parts, which includes a heating bar, means for moving the heating bar into engagement with one of the parts and in a direction toward the other part, and stop means for stopping the movement of the heated tool when it reaches a selected distance from the other part. The heating tools may either be moved to the objects to be treated, or connected, or mounted in a fixed position with the object to be treated, or connected being brought to the heated tool.

Thermal energy is either supplied to the objects to be treated, or connected by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided, for increasing the transfer of heat and for reducing oxidation during the thermal process.

Such tools may supply heat either continuously or during selected time periods only. Heat may be applied during heating pulses, which may be activated or controlled by various external conditions, for example, by forcing the heated tool against the object to be heated or connected.

Various sources of heat are known for heating the heated tool to a variety of selected temperatures. Hot gases and/or electric current, for example, may be used for heating specified heat supplying areas or surfaces of the tool.

For the present invention, it is preferable to utilize the flow of electrical current through a heated tool for heating the tool. This permits controlled pulse-heating featuring fast heating rates, as well as precise temperature control at various areas of the tool.

A known generally U-shaped heated tool is disclosed in German Patent reference No. 2,848,519. This heated tool is mounted to holders, either using screws or by welding. This keeps the heat supplying areas of the tool in position and further is used to provide electrical connectors for feeding electrical heating current to the tool. Such tools can be manufactured using sheet metal designs (see German Patent Nos. 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

Referring to FIG. 1, a U-shaped, heated tool is shown, which includes a heating bar 2 that is mechanically supported and supplied with current by support bars 1. The heating bar 2 has a heating surface 3 which is brought into contact with a round wire 4 in the direction of arrow F. Sufficient force is applied to round wire 4 to bring it into close thermal contact with a metalized layer or substrate 5 on a support material 6. If support material 6 is sensitive to heat, a danger exists of damaging material 6 if too much force and/or too much heat is supplied to the parts 4 and 5 to be connected together.

SUMMARY OF THE INVENTION

An object of the present invention is to provide an apparatus for transferring thermal energy to parts to be connected together, where at least one of the parts is supported by a temperature sensitive material. This supply of heat may be pulsed or continuous. The parts to be connected together are advantageously round wire which is to be connected to a flat metalized layer or other substrate.

The invention utilizes a heated bar which is brought into contact with the round wire and moved toward the substrate. Stop means are provided for stopping the movement of the heating bar when it reaches a selected spacing from the substrate. This helps avoid thermal damage to a support material under the substrate.

A further object of the present invention is to provide an apparatus for connecting one part to another by heating, which comprises a heated tool having a heating bar with the heating surface for being brought into contact with one of the parts, means for moving the heated tool into contact with one of the parts and in a direction toward the other part, and stop means for stopping the heated tool when it reaches a selected spacing from the other part. The stop means is advantageously a mechanical stop which is connected to the heated tool for engaging a support when the desired spacing is reached between the heating surface and the other part, or non-mechanical means, such as a magnetic field, which can sense the spacing between the heating surface and the other part and stop movement of the heated tool.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a schematic side elevational view of the heated tool for connecting two parts to each other;

FIG. 2 is a view similar to FIG. 1 showing a first embodiment of the invention;

FIG. 3 is a view similar to FIG. 2 showing another embodiment of the invention;

FIG. 4 is a view similar to FIG. 3 showing a modified form of the second embodiment;

DESCRIPTION OF THE PREFERRED EMBODIMENT

Figure 5:
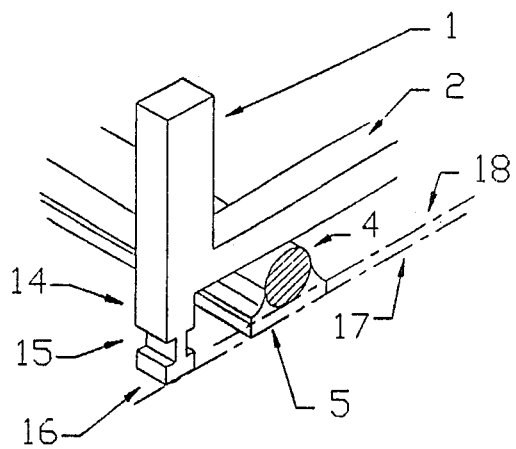
FIG. 5 is a partial perspective view of a further embodiment of the invention, showing a mechanical stop with means for dissipating heat.

Referring to the drawings in particular, the invention embodied in FIG. 2 comprises an apparatus for heating and connecting parts 4 and 5 together, which utilizes a heated tool having a heating bar 2 connected to and supported by a pair of holding bars 1 which can transmit force and current to the heating bar 2. Heating bar 2 has a heating surface 3 which is brought into contact with part 4, which is an initially round wire surrounded by flux or solder 4a for connecting the wire to a metalized layer 5 on a heat sensitive material 6. Means which are schematically represented by force arrow F are connected to the heated tool for moving the heated tool into contact with a wire 4 and toward the layer or substrate 5 to which the wire 4 is to be connected. An arm 8 extends from the heated tool and terminates in a down-stop 7. A support 9 carries the material 6 with its parts 4 and 5 thereon and includes a stop projection 7a. The downward progression of heated tool 1, 2 stops when down-stop 7 engages stop projection 7a, and a selected distance is achieved between the heating surface 3 of the heated tool and the part 5. The spacing between the heating surface 3 and the part 5 is selected to insure that the heating surface comes into good contact with, and perhaps partly distorts the wire or cable 4.

A further refinement of the invention utilizes a sensor 23 which, for example, may be a pressure sensor in down-stop 7 to sense the occurrence of a selected pressure. When this pressure occurs, the heated tool is stopped.

Alternately, 23 may symbolize a magnetic field or other proximity sensor for sensing the spacing between the heated tool and the part 5, and to stop movement in the heated tool when the selected spacing is reached.

FIG. 3 illustrates an embodiment of the invention, wherein the heated bar 2 is shaped to include portions 2a, which at least partly embrace the part 4 in the form of a round cable. Heated bar 2 is supported by support bars 10 which are connected to opposite sides of the heated bar 2. The bottom of support bars 10 extend toward the part 5 and include a heat insulation layer 11 for thermally insulating the part 5 from the heated tool. This limits the flow of heat to the part 5 and thus to the material 6. Support bars 10 can also be made to have a higher thermal mass, for example, by making the support bars thicker than the rest of the heated tool, to reduce the transmission of heat to the part 5 and material 6.

FIG. 4 illustrates a variation of the embodiment of FIG. 3, wherein support bars 13 connected to heating bar 2 are separated from the heating bar by small cross section areas 13a. Areas 13a, being of smaller cross section than the remainder of support bars 13, have increased electrical resistance and thus are heated. In the embodiment of FIG. 4, thus, heat can be transferred to the part 5. The cross sectional areas for the heating bar 2 and for the areas 13a can be selected to make the temperature of the heating bar either higher or lower than that of the areas 13a.

FIG. 5 illustrates an embodiment of the invention which limits the travel range of the heated tool 1,2, using a stop bar 14 which extends in alignment with the holder bar 1. The length of stop bar 14 can be selected either to stop the downward movement of heating bar 2 when it reaches a spacing from plane 17 corresponding to the lower surface of the part 5, or plane 18 corresponding to the upper surface of part 5. To limit the transfer of heat to the part 5, slots 15 can be cut into the lower portion of the stop bar 14 to define a foot 16 which is brought into contact with the part 5, or with a support layer supporting the part 5. Slots 15 thus form a heat sink or heat dissipating means.

Figure 6:
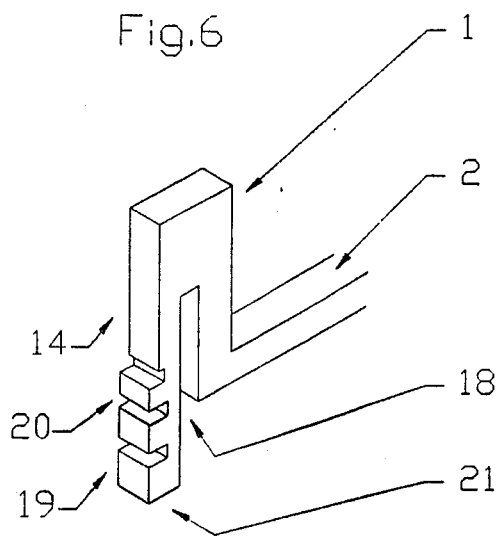
FIG. 6 is a view similar to FIG. 5 showing another embodiment of the invention, having a mechanical stop and means for dissipating heat.

FIG. 6 shows another embodiment which includes a separation slot 18 cut into the material of the heated tool between the stop bar 14 and the heating bar 2. Additional slots 22 and 19 form a heat sink on the stop bar 14 for isolating its upper end which is connected to the holder bar 1, from its lower end which is in contact with a support stop. The lower surface of bar 14 may also be provided with insulation 21 to improve the thermal isolation between the heated tool and the lower part, or its temperature sensitive support.

Figure 7:
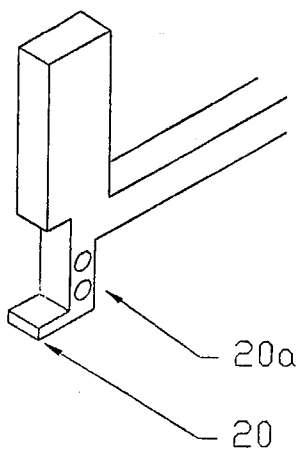
FIG. 7 is a view similar to FIG. 6 of a still further embodiment of the invention, which includes means for dissipating heat.

FIG. 7 shows another embodiment for the heat dissipating mechanism which, in this case, includes a small dimension column having holes 20a there through for thermally isolating the heated tool from a foot 20 at the end of the stop bar.

Figure 8:
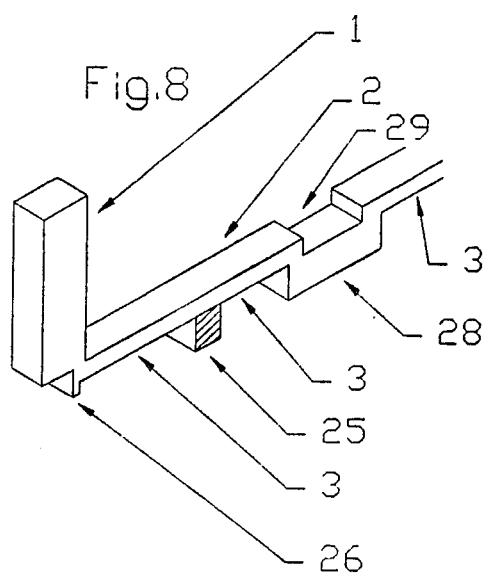
FIG. 8 is a partial, perspective view of an embodiment of the invention with a plurality of stop mechanisms.

FIG. 8 shows an embodiment of the invention which includes down-stops in the form of stops 25, 26 and 28 that are mounted on or formed integrally with the heating surface 3. Thermal and/or electrical insulation may be provided by selection of the materials for the down-stops 25, 26 and 28.

All mechanical down-stops can be made using different sizes of stop areas. Stop 25 is formed of a different part which is connected to the bottom of heating bar 2. The material of stop 25 can be selected to have an entirely different mechanical, as well as thermal characteristic, from that of the heating bar 2. Further, the temperature of stop 28 can be controlled by making its cross section larger than that of the rest of the heated bar 2. This reduces resistance to current through stop 28, thus reducing its temperature compared with the rest of the heater bar 2.

While specific embodiments of the invention have been showed and described in detail to illustrate the application of the principles of the invention, it will be understood that the invention may be embodied otherwise without departing from such principles.

What is claimed is:

1. An apparatus for connecting one part to another by heating the parts, comprising:
    a heated tool having a heating bar with a heating surface for contacting one of the parts;
    means for moving the tool into contact with the one part and in a direction toward the other part;
    stop means for stopping the movement of the tool at a selected spacing from the other part;
    said stop means comprising a mechanical stop connected to said tool and having a lower end for engagement with the other part or with a support for supporting the other part; and
    said heated tool comprising at least one holder bar connected to one end of said heating bar for applying pressure and current to said heating bar, said mechanical stop extending in substantial alignment with said holder bar and beyond said heating surface.

2. An apparatus according to claim 1, including a support for supporting the other part having an upwardly extending stop portion for engagement with the mechanical stop for stopping downward movement of the heated tool.

3. An apparatus according to claim 1, including sensor means in the mechanical stop for sensing pressure on the mechanical stop to stop movement of the heated tool.

4. An apparatus according to claim 1, wherein said heating bar comprises a shaped heating bar for at least partly embracing the one part.

5. An apparatus according to claim 4, including insulation on a lower surface of said mechanical stop, for thermally insulating said heated tool from the other part.

6. An apparatus according to claim 4, including a small cross section area between said holder bar and said heating bar, having a cross section which is smaller than that of said holder bar for being heated with the passage of current there through, along with heating of said heating bar, said small cross section area being in contact with the other part or a support for supporting the other part.

7. An apparatus according to claim 1, including heat dissipating means in said mechanical stop.

8. An apparatus according to claim 7, wherein said mechanical stop comprises a stop bar extending below said holder bar, said heat dissipating means comprising a heat sink in said stop bar.

9. An apparatus according to claim 8, wherein said heat sink comprises at least one slot in said stop bar.

10. An apparatus according to claim 8, wherein said heat dissipating means comprises at least one hole through said stop bar.

11. An apparatus according to claim 8, including a slot in said holder bar separating said stop bar from said heating bar.

12. An apparatus according to claim 1, wherein said sensor means comprises a magnetic sensor for sensing the distance between said heating surface and the other part.

13. An apparatus for connecting one part to another by heating the parts, comprising:
a heated tool having a heating bar with a heating surface for contacting one of the parts;
means for moving the tool into contact with the one part and in a direction toward the other part; and
stop means for stopping the movement of the tool at a selected spacing from the other part, said stop means comprising at least one stop projection extending from said heating surface, said stop projection being of different material from that of said heating bar.

* * * * *